United States Patent
Heinonen et al.

(10) Patent No.: US 6,363,127 B1
(45) Date of Patent: Mar. 26, 2002

(54) AUTOMATIC GAIN CONTROL METHODS AND APPARATUS SUITABLE FOR USE IN OFDM RECEIVERS

(75) Inventors: Jari M. Heinonen, Seattle; Michael R. Hirano, Redmond; Hongliang Zhang, Bellevue, all of WA (US)

(73) Assignee: AT&T Wireless Services, Inc., Redmond, WA (US)

(*) Notice: Subject to any disclaimer, the term of this patent is extended or adjusted under 35 U.S.C. 154(b) by 0 days.

(21) Appl. No.: 09/591,043

(22) Filed: Jun. 9, 2000

Related U.S. Application Data

(60) Provisional application No. 60/140,622, filed on Jun. 23, 1999.

(51) Int. Cl.[7] ............................................. H04L 27/08
(52) U.S. Cl. ................ 375/345; 455/234.1; 455/240.1; 455/245.2; 455/251.1
(58) Field of Search ............................. 375/260, 345, 375/222; 455/136, 138, 139, 219, 234.1, 237.1, 239.1, 240.1, 241.1, 245.1, 245.2, 247.1, 251.1

(56) References Cited

U.S. PATENT DOCUMENTS

| | | | |
|---|---|---|---|
| 4,206,320 A | 6/1980 | Keasler et al. | |
| 4,870,370 A | 9/1989 | Hedberg et al. | 330/133 |
| 5,029,162 A | 7/1991 | Epps | 370/77 |
| 5,040,194 A | 8/1991 | Tjahjadi et al. | 375/98 |
| 5,422,601 A | 6/1995 | Kovacs et al. | |
| 5,493,712 A | 2/1996 | Ramesh et al. | 455/234.2 |
| 5,563,916 A * | 10/1996 | Scarpa | 375/345 |
| 5,572,264 A * | 11/1996 | Mizukami et al. | 348/735 |
| 5,617,060 A | 4/1997 | Wilson et al. | 330/129 |
| 5,878,089 A * | 3/1999 | Dapper et al. | 375/325 |
| 5,940,143 A * | 8/1999 | Igarashi et al. | 348/678 |
| 6,175,550 B1 * | 1/2001 | van Nee | 370/206 |

FOREIGN PATENT DOCUMENTS

| | | |
|---|---|---|
| EP | 0506547 A1 | 3/1992 |
| EP | 0788265 A2 | 8/1997 |

OTHER PUBLICATIONS

PCT, International Search Report for PCT/ US 00/ 15837, Mailed Oct. 4, 2000, (4 pgs.).
Patent Abstracts of Japan, "Receiver", Pub. No. 10271088, Oct. 9, 1998.
Patent Abstracts of Japan, "Receiver For Digital Audio Broadcast", Pub. No. 10336142, Dec. 18, 1998.

* cited by examiner

Primary Examiner—Don N. Vo
(74) Attorney, Agent, or Firm—Gray Cary Ware & Freidenrich

(57) ABSTRACT

Automatic gain control (AGC) methods and apparatus suitable for use in orthogonal frequency division multiplexing (OFDM) receivers are described. One AGC method includes the steps of repeatedly performing a first AGC process which adjusts amplifier gain based on determining that a signal level of multiple time sample values is outside a limit set by a first predefined threshold; and repeatedly performing a second AGC process which adjusts the amplifier gain based on determining that a signal level of multiple frequency sample values associated with a plurality of pilot tones is outside a limit set by a second predefined threshold. Preferably, the first AGC process is performed repeatedly at a first rate and the second AGC process is performed repeatedly at a second rate that is less than the first rate.

14 Claims, 9 Drawing Sheets

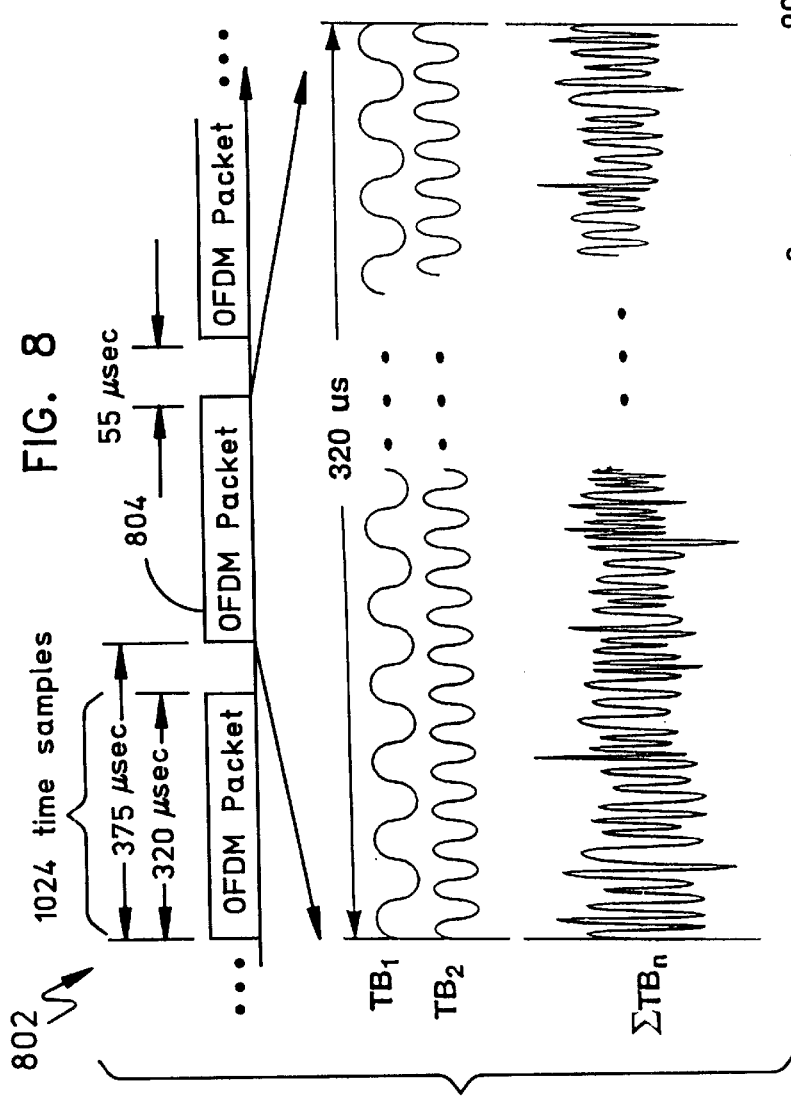
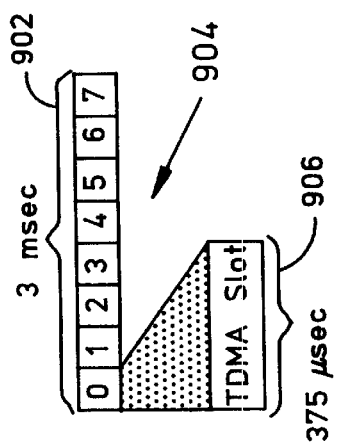
FIG. 8
FIG. 9

AUTOMATIC GAIN CONTROL METHODS AND APPARATUS SUITABLE FOR USE IN OFDM RECEIVERS

RELATED APPLICATION

This Application claims the benefit of U.S. Provisional Application No. 60/140,622, filed Jun. 23, 1999 and entitled "Method for Automatic Gain Control in a Personal Wireless Access Network," which is incorporated herein by reference.

BACKGROUND OF THE INVENTION

1. Field of the Invention

The present invention relates generally to the fields of automatic gain control (AGC) in orthogonal frequency division multiplexing (OFDM) communication receivers.

2. Description of the Related Art

Orthogonal frequency division multiplexing (OFDM) is a robust technique for efficiently transmitting data over a channel. This technique uses a plurality of sub-carrier frequencies (sub-carriers) within a channel bandwidth to transmit the data. These sub-carriers are arranged for optimal bandwidth efficiency compared to more conventional transmission approaches, such as frequency division multiplexing (FDM), which waste large portions of the channel bandwidth in order to separate and isolate the sub-carrier frequency spectra and thereby avoid inter-carrier interference (ICI). By contrast, although the frequency spectra of OFDM sub-carriers overlap significantly within the OFDM channel bandwidth, OFDM nonetheless allows resolution and recovery of the information that has been modulated onto each sub-carrier. Additionally, OFDM is much less susceptible to data loss due to multipath fading than other conventional approaches for data transmission because inter-symbol interference is prevented through the use of OFDM symbols that are long in comparison to the length of the channel impulse response. Also, the coding of data onto the OFDM sub-carriers can take advantage of frequency diversity to mitigate loss due to frequency-selective fading.

A digital receiver, such as an OFDM communication receiver, will generally include a variable gain amplifier where a gain of the amplifier is adjusted by a control signal. The process of adjusting the gain of a received signal using a control signal is called automatic gain control (AGC). Typically, an AGC process in a digital receiver involves measurement of an output signal power of the variable gain amplifier. The measured value is compared with a value representing the desired signal power and an error value for the variable gain amplifier is generated. The error value is then used to control amplifier gain so as to adjust the signal strength to coincide with the desired signal power. To affect digital demodulation with an optimal signal-to-noise ratio (SNR), AGC is used to hold the magnitude of the waveforms close to the full dynamic range of the analog-to-digital converters. This generally requires, however, that AGC be provided over the full dynamic range of the received signal power. Unfortunately, in wireless environments, a digital receiver may receive a signal which experiences rapid and wide variations in signal power due to, e.g., channel fading and other causes.

Accordingly, there is an existing need to provide an automatic gain control in an OFDM receiver that can sufficiently and rapidly handle wide fluctuations in signal power due to channel fading and other causes.

SUMMARY OF THE INVENTION

Automatic gain control (AGC) methods and apparatus suitable for use in orthogonal frequency division multiplexing (OFDM) receivers are described. One AGC method includes the steps of repeatedly performing a first AGC process which adjusts amplifier gain based on determining that a signal level of multiple time sample values is outside a limit set by a first predefined threshold; and repeatedly performing a second AGC process which adjusts the amplifier gain based on determining that a signal level of multiple frequency sample values associated with a plurality of pilot tones is outside a limit set by a second predefined threshold. Preferably, the first AGC process is performed repeatedly at a first rate and the second AGC process is performed repeatedly at a second rate that is less than the first rate.

BRIEF DESCRIPTION OF THE DRAWINGS

FIG. 8 is a timing diagram showing radio frequency (RF) OFDM signals and OFDM packets in the wireless communication system;

FIG. 9 is an illustrative representation of the relationship between time slots and time frames utilized in the wireless communication system;

DETAILED DESCRIPTION OF THE PREFERRED EMBODIMENTS

Automatic gain control (AGC) methods and apparatus suitable for use in orthogonal frequency division multiplexing (OFDM) receivers are described. One AGC method includes the steps of repeatedly performing a first AGC process which adjusts amplifier gain based on determining that a signal level of multiple time sample values is outside a limit set by a first predefined threshold; and repeatedly performing a second AGC process which adjusts the amplifier gain based on determining that a signal level of multiple frequency sample values associated with a plurality of pilot tones is outside a limit set by a second predefined threshold. Preferably, the first AGC process is performed repeatedly at a first rate and the second AGC process is performed repeatedly at a second rate that is less than the first rate.

Figure 1:
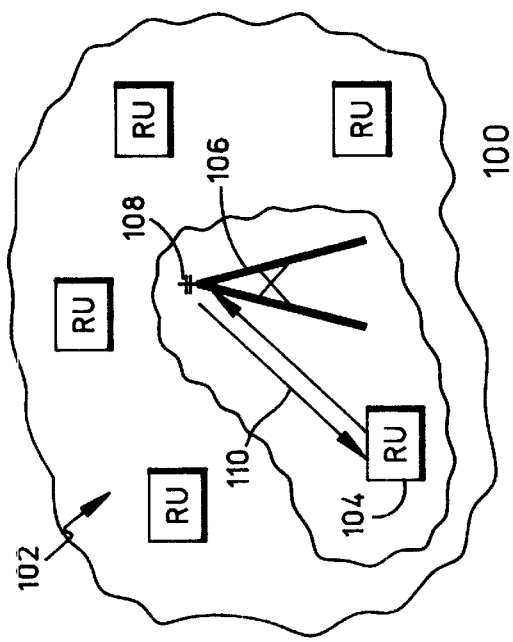
FIG. 1 is a diagram of a wireless communication system, such as a fixed wireless system utilizing orthogonal frequency division multiplexing (OFDM) communication techniques, which includes one or more base units and one or more receiver units.

FIG. 1 is an illustrative representation of a wireless communication system 100 which utilizes orthogonal frequency division multiplexing (OFDM) or OFDM-like communication methodologies. Wireless communication system 100 includes at least one base unit 106 having one or more antennas 108, and a plurality of remote units 102 ("RUs" or "receiver units"), such as remote unit 104. Base unit 106 and remote units 102 communicate via radio frequency (RF) signals, such as RF signals 110 between base unit 106 and remote unit 104. Wireless communication system 100 can make use of a number of different communication techniques, such as frequency division multiple access (FDMA), time division multiple access (TDMA), or time division duplex (TDD). Preferably, wireless communication system 100 is a fixed wireless system (FWS), where base unit 106 provides telephone and high-speed data communication to each one of a number of fixed-location subscribers equipped with an RU. Also, the RF OFDM communications signals are modulated using 16 quadrature amplitude modulation (QAM), but could be modulated using quadrature phase shift keying (QPSK).

Figure 2:
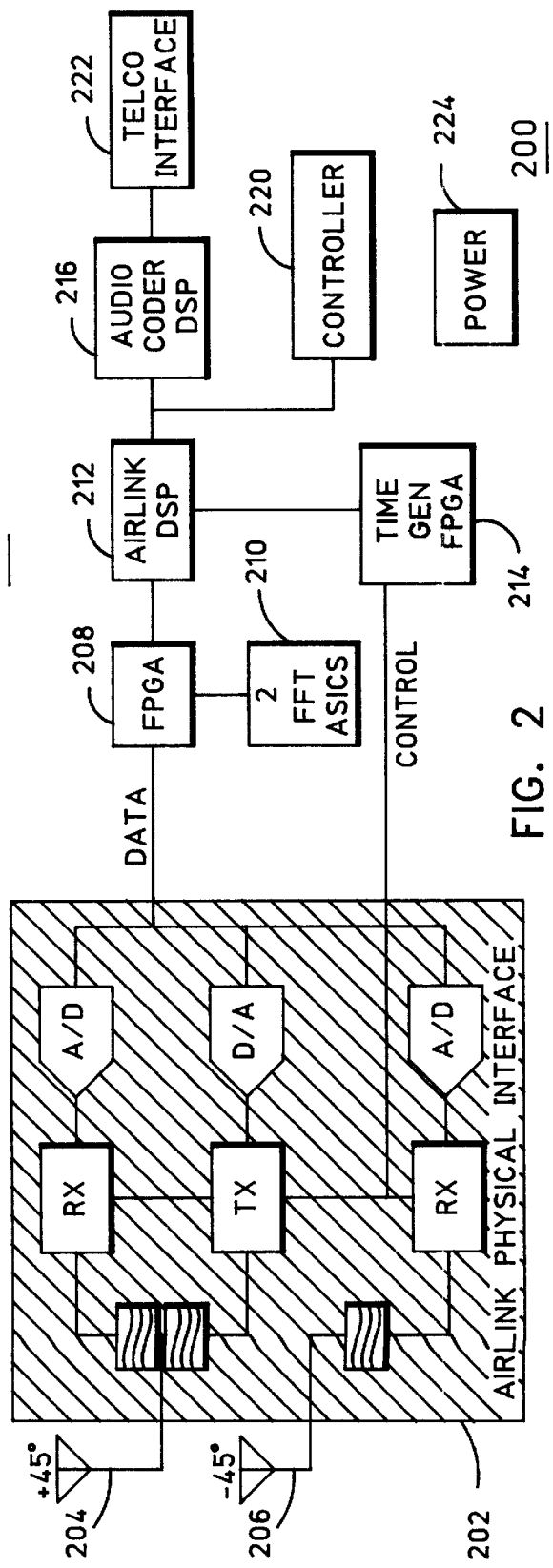
FIG. 2 is a block diagram of electronic components of a receiver unit in the wireless communication system of FIG. 1.

FIG. 2 is a block diagram of electronic components 200 of receiver unit 104 in wireless communication system 100 of FIG. 1. As shown, electronic components 200 include diversity antennas 204 and 206 coupled to an airlink physical interface 202, a field programmable gate array (FPGA) 208, two Fast Fourier Transform (FFT) application-specific integrated circuits (ASICs) 210, an airlink digital signal processor (DSP) 212, a time generator FPGA 214, an audio coder DSP 216, a controller 220, a telco interface 222, and power supply circuitry 224. Airlink physical interface 202 has a two-branch RF receiver with two analog-to-digital (A/D) converters, and a single branch RF transmitter with a digital-to-analog (D/A) converter. FFT ASICs 210 and FPGA 208 provide a time-frequency domain translation engine for OFDM waveforms. Airlink DSP 212 performs airlink physical layer processing and audio coder DSP 216 performs the OFDM waveform coding and decoding functions. Time generation FPGA 214 provides a serial time division multiplex (TDM) interface along with hardware support for RF control. Telco interface 222 has a subscriber link interface circuit to provide an interface to a customer's telephone wiring. Controller 220 provides control for most of these devices, and power supply circuitry 224 provides electrical power for operation of the devices. Preferably, airlink and audio coder DSPs 212 and 216 utilize DSPs provided by Texas Instruments and controller 220 utilizes an MC68360 Quad Integrated Communications Controller (QUICC) CPU provided by Motorola, Inc.

Referring ahead to FIG. 8, each base unit of the wireless communication system broadcasts a plurality of OFDM packets 802, such as an OFDM packet 804, to a corresponding receiver unit. A new OFDM packet is broadcasted once every predetermined time period. Each predetermined time period is associated with a time slot, such as a time slot 906 of FIG. 9. As indicated in FIG. 9, a plurality of consecutive time slots 904 corresponds to a time frame 902. In the preferred embodiment shown, each time slot has a duration of 375 microseconds, each OFDM packet is 320 microseconds in length, and each time frame corresponds to 8 time slots for a duration of 3 milliseconds.

In this way, each base unit transmits "traffic tones" and "pilot tones" to a corresponding remote unit. In general, traffic tones are utilized for the communication of voice and/or data, whereas pilot tones are utilized for control. The amplitude and phase of pilot tones remain relatively constant over time, while the amplitude and phase of traffic tones vary over time. To receive the traffic tones and pilot tones, each receiver unit samples and quantizes the OFDM waveform at a sampling rate to generate time domain samples and converts the time domain samples into frequency domain signals (e.g., traffic or pilot tones).

Figure 10:
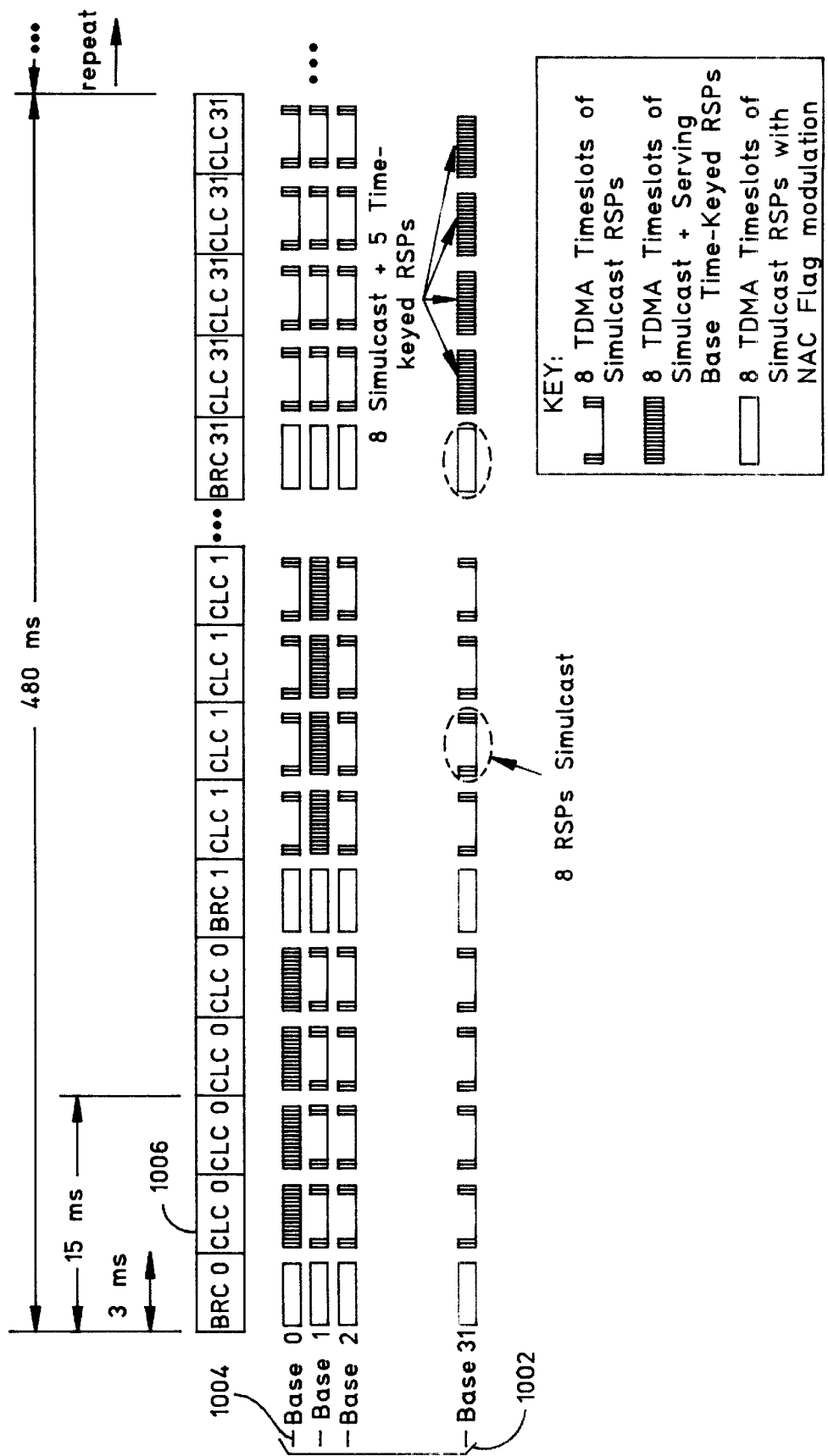
FIG. 10 is an illustrative representation of the timing and frequency relationships of pilot tones in the wireless communication system.
Figure 11:
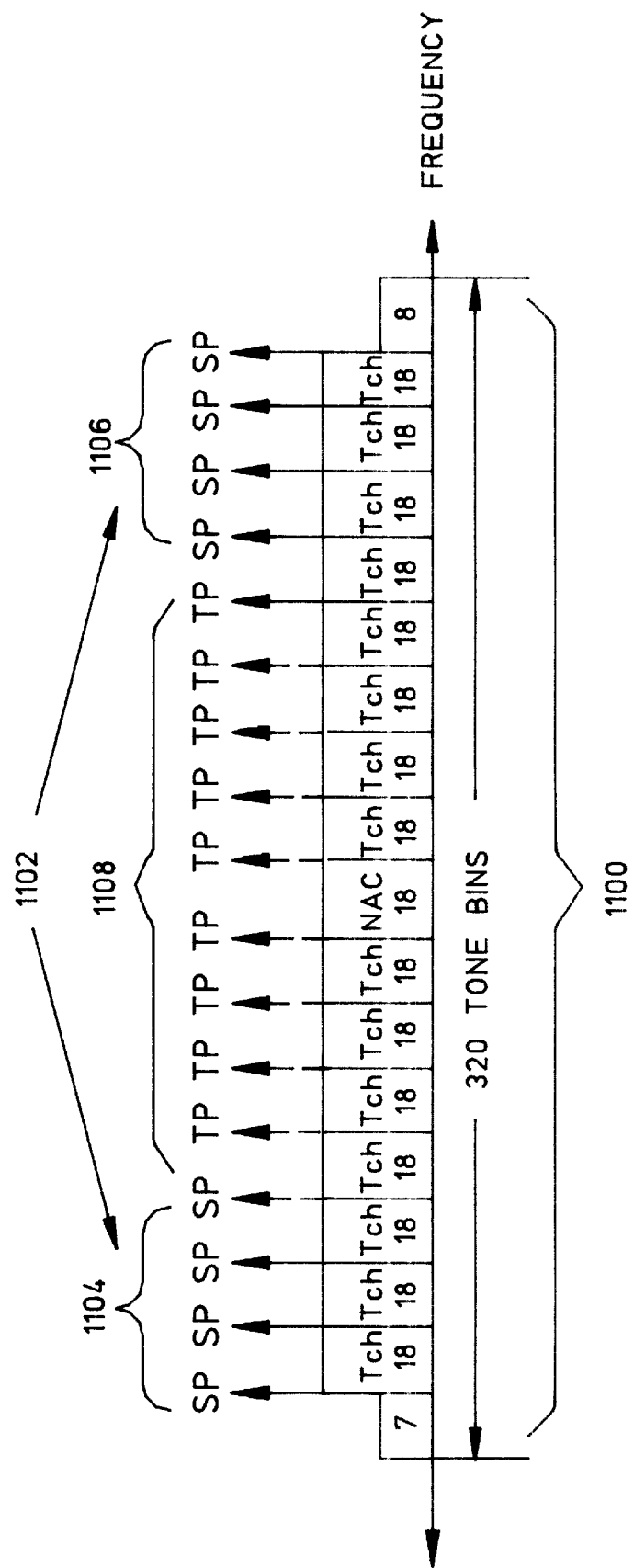
FIG. 11 is an illustrative representation of the frequency layout of pilot tones and traffic tones in the wireless communication system.

FIG. 10 is an illustrative representation of timing relationships in the broadcasting of pilot tones for each base unit of a plurality of base units 1002, such as a base unit 1004. For each time frame, such as a time frame 1006, pilot tones are generally arranged in frequency as described in relation to FIG. 11. A set of pilot tones 1100 represented in FIG. 11 includes a subset of simulcast pilot tones 1102 (each designated "SP"), and may include a subset of time-keyed pilot tones 1108 (each designated "TP"). As indicated in FIG. 11, traffic tones (designated "Tch") are positioned in frequency in between adjacent pilot tones. Referring back to FIG. 10, each one of base units 1002 broadcasts time-keyed pilot tones only a portion of the time. More particularly, each base unit repeatedly takes a turn in broadcasting the time-keyed pilot tones in the designated frequency space. Time-keyed pilot tones are utilized for a portion of the AGC process which will be described later below.

In the preferred embodiment, and as shown in FIG. 11, wireless communication system 100 of FIG. 1 utilizes 8 simulcast pilot tones (4 positioned in frequency on each side of the time-keyed pilot tones), 9 time-keyed pilot tones, and 18 traffic tones positioned in between adjacent pilot tones. Also preferably, each frequency band has a bandwidth $f_{band}$=1 MHz and each tone has a 3125 Hz bandwidth (1 FFT tone bin width). The frequency gap $f_s$ between adjacent pilot tones is 56.25 kHz (18 FFT tone bins) and the frequency gap $f_{int}$ between adjacent frequency bands is 46.875 kHz (15 FFT tone bins). In addition, 18 traffic tones (18 FFT tone bins) are positioned in between adjacent pilot tones.

Figure 3:
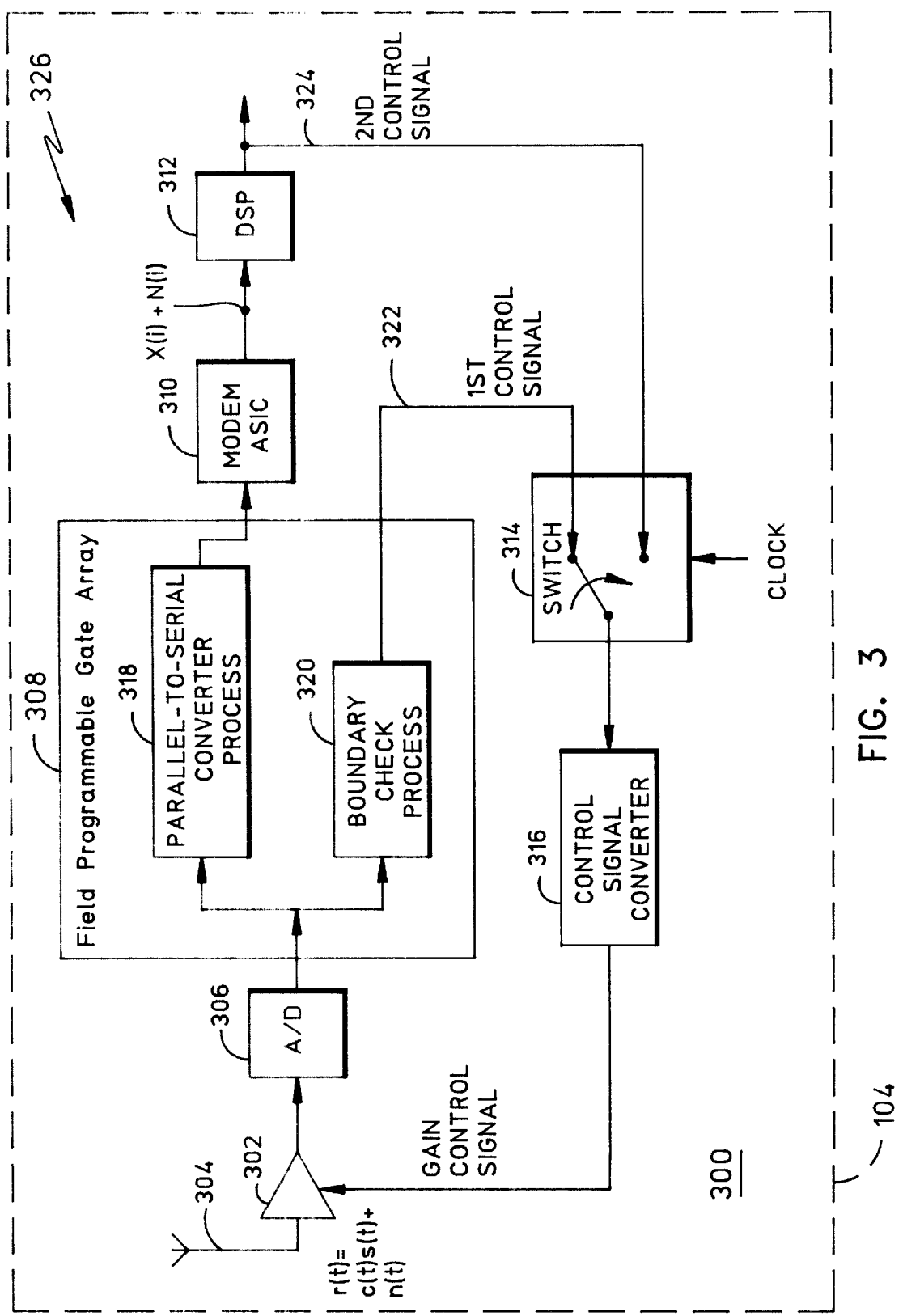
FIG. 3 is a block diagram of more specific electronic components of the receiver unit of FIGS. 1 and 2, which is more closely related to the automatic gain control (AGC) of the present invention.

FIG. 3 is a block diagram of more specific electronic components 300 of receiver unit 104 of FIG. 1. Electronic components 300 are more directly related to the automatic gain control (AGC) which is the subject of the present invention, and may be part of those electronic components described in relation to FIG. 2. Electronic components 300 include an antenna 304, amplifier circuitry 302, an analog-to-digital (A/D) converter 306, a field programmable gate array (FPGA) 308, a modem application-specific integrated circuit (ASIC) 310, a digital signal processor (DSP) 312, switch circuitry 314, and a signal converter 316. Although other suitable processors and connections may be utilized, FPGA 308 and DSP 312 are one or more processors 326 of receiver unit 104. FPGA 308, which may be any suitable high-speed processor, includes processor instructions to execute a parallel-to-serial converter process 318 and a boundary check process 320 for the AGC.

Antenna 304 is coupled to an input of amplifier circuitry 302, which has an output coupled to an input of A/D converter 306. An output of A/D converter 306 is coupled to an input of FPGA 308, where time domain samples at the output of A/D converter 306 are fed into parallel-to-serial converter process 318 and into boundary check process 320. An output of parallel-to-serial converter process 318 is fed into an input of modem ASIC 310, which has an output which is coupled to an input of DSP 312. An output of boundary check process 320 is coupled to a first input to switch circuitry 314, and an output of DSP 312 is coupled to a second input to switch circuitry 314. An output of switch circuitry 314 is coupled to an input to signal converter 316, which has an output coupled to a gain control input of amplifier circuitry 302.

Figure 5:
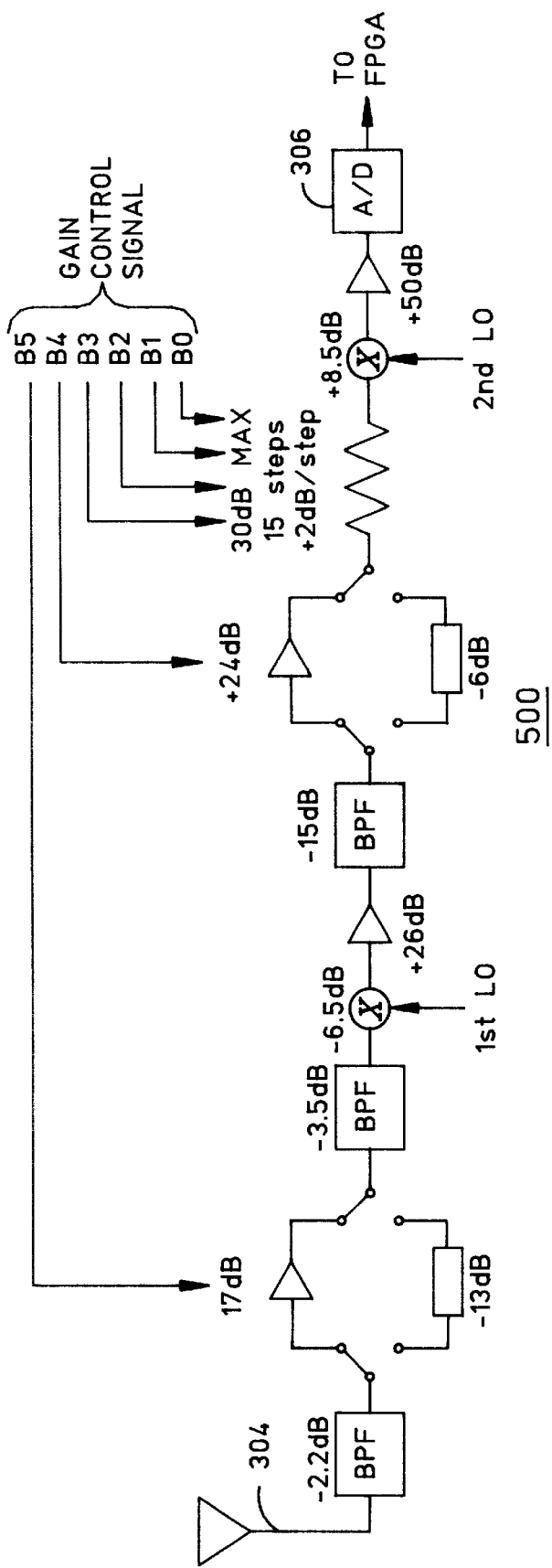
FIG. 5 is a schematic diagram of more detailed amplifier circuitry which may be utilized in the electronic components of FIG. 3.

Antenna 304 receives RF OFDM communication signals which are amplified by amplifier circuitry 302 at a gain determined by a gain control signal provided at the output of signal converter 316. Although amplifier circuitry 302 and its gain control may utilize simple well-known circuits, it may alternatively utilize multi-stage amplification and control as shown with amplifier components 500 of FIG. 5. As shown in FIG. 5, RF OFDM signals pass through multiple bandpass filters, multiple amplifiers and attenuators, and multiple mixers with local oscillator (LO) signals. The multi-bit gain control signal, shown in FIG. 5 as having six bits (B0, B1, B2, B3, B4, and B5), controls the selection and/or insertion of amplifiers and attenuators within the signal path.

Figure 4:
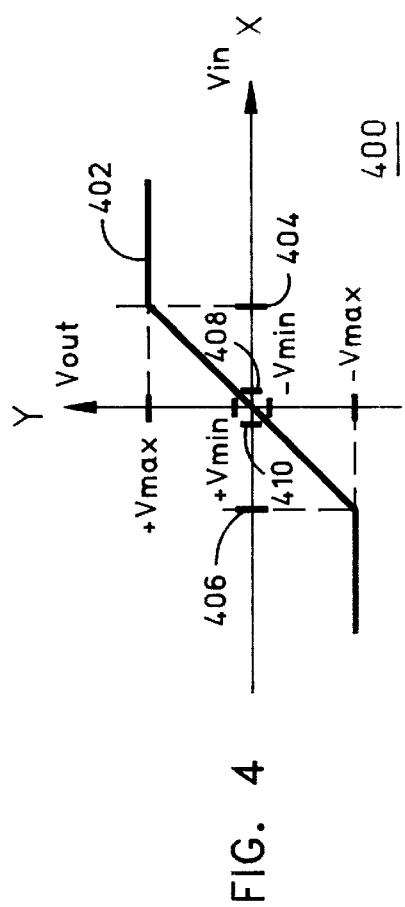
FIG. 4 is a graph which represents a response of an analog-to-digital (A/D) converter in the electronic components of FIG. 3.

Referring back to FIG. 3, the amplified signals from amplifier circuitry 302 are sampled and quantized at A/D converter 306. Thus, a plurality of time domain samples are provided at the output of A/D converter 306 and fed into FPGA 308. In this embodiment, the sampling frequency is 3.2 Mhz and the time domain samples are 16-QAM OFDM signals which are real values. The amplified signals at the input of A/D converter 306 may, however, vary greatly in amplitude and be "clipped" by A/D converter 306. A graph 400 in FIG. 4 shows the response of A/D converter 306, where an analog input signal to A/D converter 306 is shown along the X-axis and a digital output signal of A/D converter 306 is shown along the Y-axis. Output signals from A/D converter 306 are clipped when the analog input signal exceeds a voltage designated at a point 404 ($+V_{max}$), or exceeds a negative voltage designated at a point 406 ($-V_{max}$). On the other hand, output signals from A/D converter 306 may have large quantization errors if the signals are too small, as designated by points 408 ($+V_{min}$) and 410 ($-V_{min}$) in FIG. 4.

Referring again back to FIG. 3, the plurality of time domain samples from A/D circuitry 306 are received at FPGA 308 and operated upon by boundary check process 320 and parallel-to-serial converter process 318. Boundary check process 320 is operative to determine if multiple time sample values associated with multiple time samples are outside a limit set by a predefined threshold and, if so, establish a control signal at an output 322 to appropriately adjust the gain of amplifier circuitry 302. Each time sample value may be calculated based on, for example, the absolute value or magnitude of a time sample, or the square or power of a time sample. In a more general sense, boundary check process 320 is operative to determine whether signals from A/D converter 306 are clipped and, if so, provide the appropriate gain adjustment signals. This operation occurs repeatedly for new sets of time domain samples, e.g., for a burst of time domain samples received once every 48 milliseconds. This first part of the overall AGC process will be described in more detail below in relation to FIG. 6.

Parallel-to-serial converter process 318 is operative to receive the incoming parallel time domain samples from A/D converter 306 and provide them in a serial fashion to modem ASIC 310 for further processing. Modem ASIC 310, which may be referred to as a Fast Fourier Transform (FFT) ASIC or process, converts the samples from the time domain to the frequency domain as is well-known in the art. DSP 312 processes the frequency domain signals for the receipt of voice and data for the receiver unit, as well as for control purposes including AGC. In general, DSP 312 is operative to determine whether a power of multiple frequency signal values associated with a set of pilot tone signals is outside a limit set by a predefined threshold and, if so, establish a control signal at an output 324 to appropriately adjust the gain of amplifier circuitry 302. This operation occurs repeatedly for new sets of pilot tones, for example, for a set of time-keyed pilot tones received once every 480 milliseconds. This second part of the overall AGC process will be described in more detail below in relation to FIG. 7.

Figure 12:
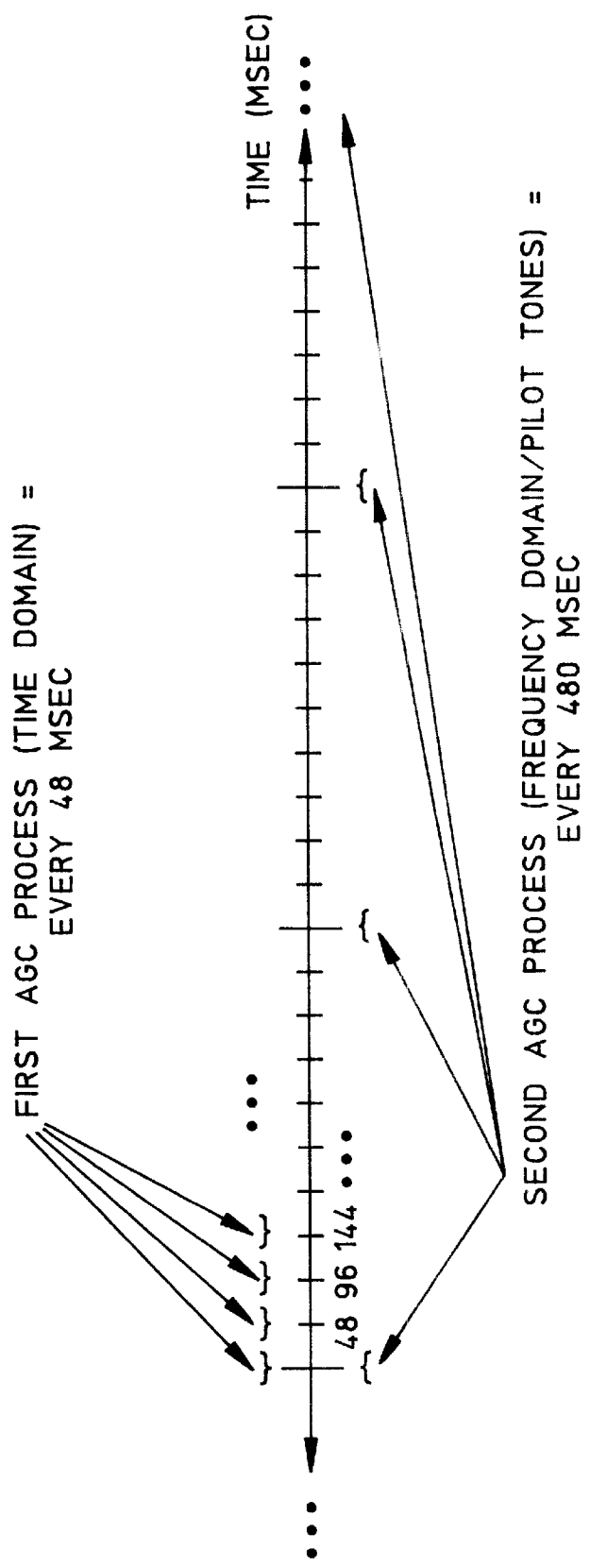
FIG. 12 is an illustrative representation of the timing relationships with respect to the first AGC method and the second AGC method.

Thus, a first AGC process (primarily performed in FPGA 308) is repeatedly executed every 48 milliseconds and a second AGC process (primarily performed in DSP 312) is repeatedly executed every 480 milliseconds. This timing is illustrated in FIG. 12. In a broader sense, the first AGC process is repeatedly performed at a first rate and the second AGC process is repeatedly performed at a second rate that is less than the first rate. New results are determined by the first and second AGC processes within or after each processing interval.

Referring back to FIG. 3, the control signals at outputs 322 and 324 are fed into switch circuitry 314, which controls the selection or application of the control signals to amplifier circuitry 302 through signal converter 316. Each one of the control signals at outputs 322 and 324 may indicate one of three different gain adjustments: (1) decrease gain; (2) increase gain; or (3) hold/maintain the previously set gain. (The increase gain signal and related processing for output 322 is optional.) As described above, the control signal at output 322 is generated at a first rate while the control signal at output 324 is generated at a second rate that is less than the first rate. A clock signal is applied at switch circuitry 314 to control the selection of one of outputs 322 and 324 and the application or latching of the selected control signal to signal converter 316. Switch circuitry 314 applies the control signal at output 322 to signal converter 316 once every expiration of time X and applies the control signal at output 324 to signal converter 316 once every expiration of time Y>X. As described above, the control signal at output 322 is generated every 48 milliseconds and the control signal at output 324 is generated every 480 milliseconds. Therefore, switch circuitry 314 selects output 322 every 48 milliseconds and selects output 324 every 480 milliseconds for application to signal converter 316. Since the number 48 divides into the number 480 without any remainder, switch circuitry 314 selects output 322 as a higher priority if the control signal at output 322 indicates a gain adjustment.

As described above, the amplifier gain control may be designed so that the amplifier circuitry can be set at one of a number of different predefined settings (e.g., see FIG. 5). The control signals provided at outputs 322 and 324, however, merely request what change in amplifier gain should be made. Therefore, signal converter 316 is provided to select one of the amplifier gain settings (e.g., one of the 64 amplifier gain settings from the 6-bit control in FIG. 5) based on the previously set amplifier gain and the requested change in gain from output 322 or 324. For example, if the gain was previously set to 4 dB, and a request is made to increase the gain by 2 dB, signal converter 316 selects a 6 dB amplifier gain setting (e.g., sets B0 and B1 in FIG. 5). As one skilled in the art will understand, the described signal conversion may be necessary only for more involved amplifier circuitry and gain control designs.

Figure 6:
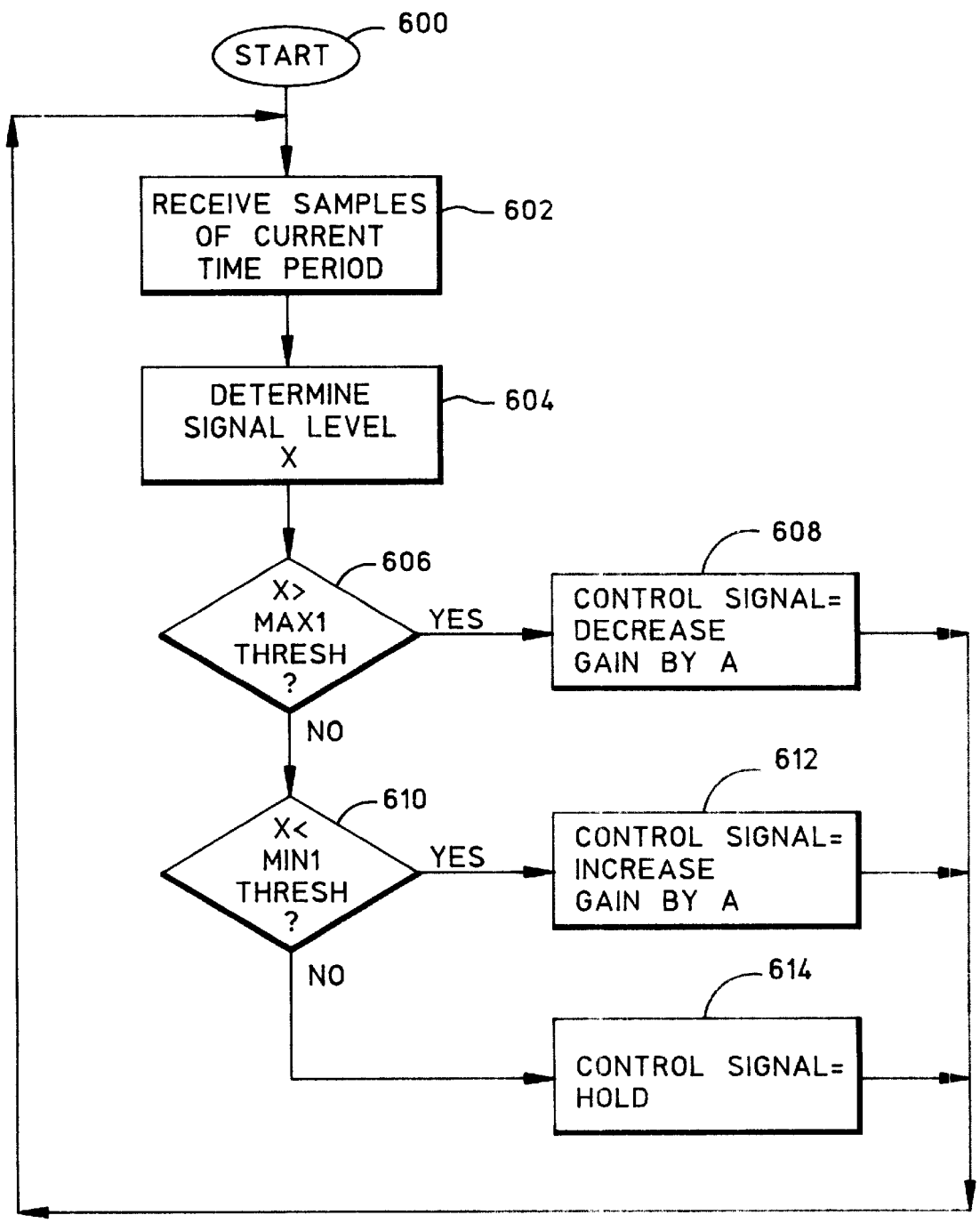
FIG. 6 is a flowchart of a first method for use in providing automatic gain control in the receiver unit.

FIG. 6 is a flowchart describing a method for use in providing AGC in a receiver unit, which is the method that boundary check process 320 of FIG. 3 may execute. Beginning at a start block 600, a plurality of time domain samples is received over a predetermined period of time (step 602) and a plurality of time sample values is generated therefrom.

The time sample values may be obtained by, for example, taking the absolute values or magnitudes of the time domain samples, or calculating the squares or powers of the time domain samples. In any case, an indication of the signal level or power of multiple time domain samples is determined (step 604). The calculations may be based on the root-mean-square (RMS) of the time domain samples, the RMS in this context being the square root of the sum of the squares of the magnitudes of the time domain samples divided by the total number of samples.

If it is determined that the signal level over the predetermined period of time is greater than a predefined maximum threshold at step 606 (e.g., the threshold associated with point 404 in FIG. 4), then a control signal is provided that decreases a gain of the amplifier circuitry (step 608). If it is determined that the signal level is less than a predefined minimum threshold at step 610 (e.g., the threshold associated with point 408 in FIG. 4), then a control signal is provided that increases a gain of the amplifier circuitry (step 612). If the signal level is within the predefined maximum and minimum thresholds, then a control signal is provided that holds or maintains a previously set gain of the amplifier circuitry (step 614). The flowchart repeats continually starting at step 602 for the next plurality of time domain samples.

In the embodiment described, the gain adjustment in the increase and decrease in steps 608 and 612 of FIG. 6 is of the same magnitude ("A"), preferably at +/−2 dB. Also, there are 1024 time domain samples (a single time burst) utilized in each pass through the flowchart of FIG. 6, and each pass through occurs once every 48 milliseconds. However, a larger or smaller number of samples may be utilized and are not limited to boundaries of any time burst, slot, or frame.

A more particular way of performing a portion of method of FIG. 6 (as it relates to determining if the signals are clipped) will now be described. The following steps are performed for each sample of the plurality of time domain samples (e.g., each one of 1024 samples). First, a time sample value is determined from the time domain sample. The time sample value may be, for example, the absolute value or the square of the time domain sample (or a value proportional thereto). Next, the time sample value is compared to a predefined upper threshold. If the time sample value exceeds the predefined upper threshold, then an upper limit counter is incremented. If the upper limit counter exceeds a predefined upper limit counter threshold (where the threshold is based on, e.g., some number or percentage, such as 5% of the samples), then it is determined that the signals are clipped and the gain is decreased. If the upper limit counter never exceeds the predefined upper limit counter for the plurality of time samples, then the previously set gain is held. The upper limit counter is cleared for each plurality of time domain samples (e.g., every 1024 samples).

An even more particular way of performing the method of FIG. 6 (as it further relates to determining if large quantization errors may exist) will now be described. The signal value previously generated is also compared to a predefined lower threshold. Here, if the signal value is less than the predefined lower threshold, then a lower limit counter is incremented. If the lower limit counter exceeds a predefined lower limit counter threshold (where the threshold is based on, e.g., some number or percentage, such as 5% of the samples), then it is determined that the signals from A/D circuitry may have large quantization errors and the gain is increased. If the upper and lower limit counters never exceed their respective thresholds, then the previously set gain is held. The lower limit counter is cleared for each plurality of time domain samples (e.g., every 1024 samples). To achieve the same results in these methods, a counter may be initially set to some non-zero value (e.g., set to the predefined counter threshold), decremented when a signal value is outside the predefined threshold, and compared with some threshold (e.g., zero) to determine whether gain adjustment should be made.

Figure 7:
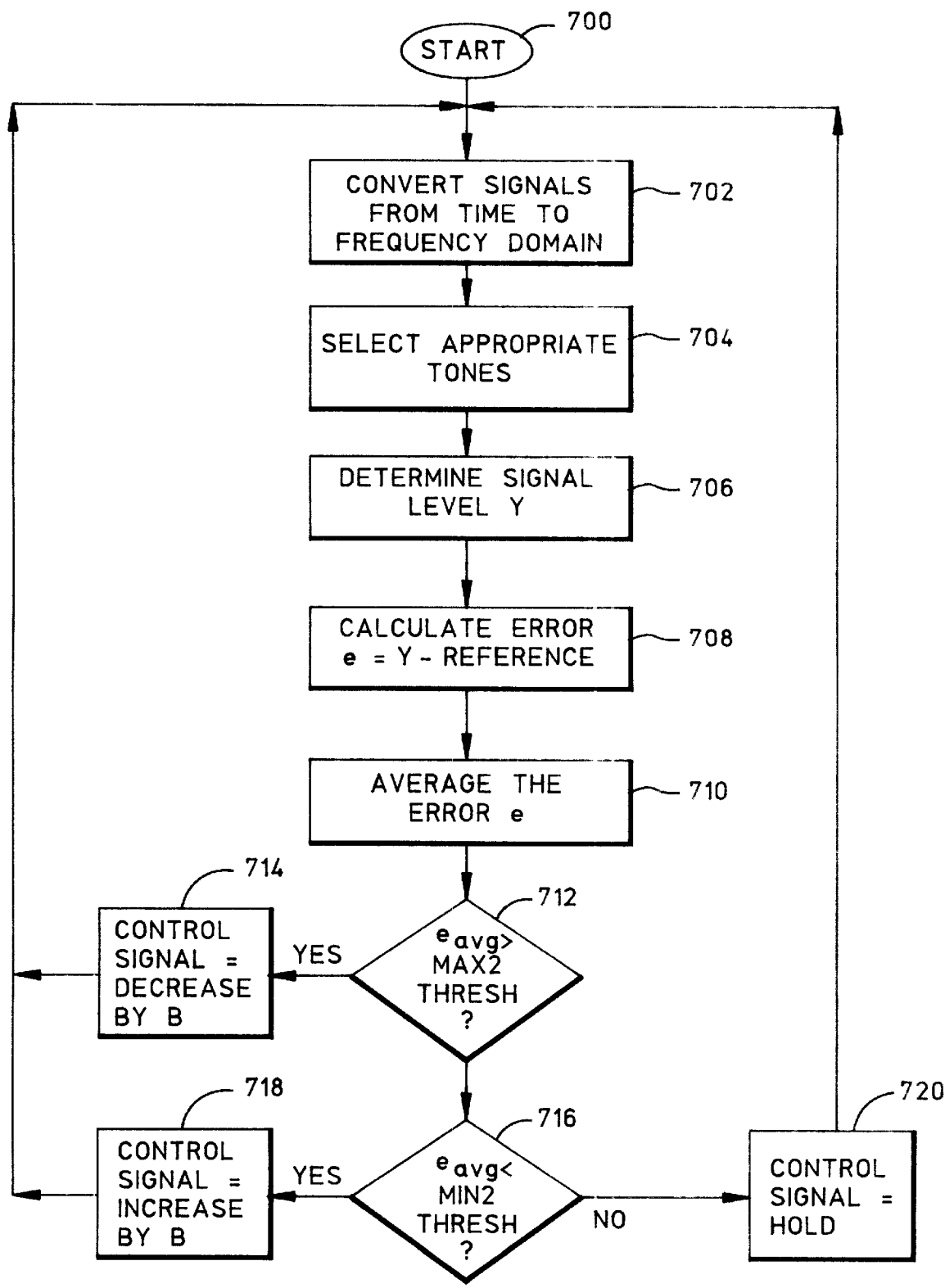
FIG. 7 is a flowchart of a second method for use in providing automatic gain control in the receiver unit.

FIG. 7 is a flowchart describing a method for use in providing AGC in a receiver unit, which is the method that modem ASIC 310 and DSP 312 may execute. Beginning at a start block 700, a plurality of time domain samples of a time slot (having, e.g., 1024 time samples) are converted from the time domain to the frequency domain (step 702). Particular ones of the frequency sample values are selected (step 704), namely, the frequency sample values corresponding to a plurality of pilot tone signals. Preferably, these pilot tone signals are a set of time-keyed pilot tones transmitted by a particular base unit and intended for receipt by the receiver unit (see FIGS. 10 and 11). For example, the selected time-keyed pilot tones may correspond to only those broadcast by base unit 1004 ("Base 0") of FIG. 10. As shown in the preferred embodiment of FIG. 11, there are 9 time-keyed pilot tones per time slot.

According to one embodiment, the signal level of these frequency domain samples is determined (step 706) after the appropriate tones are selected in step 704 of FIG. 7. Thereafter, steps 702–706 are repeated for each slot of multiple consecutive time slots, where the signal level is averaged. For example, steps 702–706 may be executed for each one of 32 time slots, for total processing of 288 pilot tones (9 time-keyed pilot tones per time slot×8 time slots per time frame×4 time frames=288 pilot tones). According to another embodiment, however, after the appropriate tones are selected in step 704 of FIG. 7, steps 702–704 are repeated for each one of multiple consecutive time slots, and the signal level is determined based on an average of all of the accumulated pilot tone values. Preferably, for the above-described processes, calculations based on a root mean square (RMS) of the pilot tones are performed.

Next, an error "e" is calculated by subtracting a reference signal level from the signal level (step 708). Preferably, the error is averaged over a time period or some number of 480 millisecond cycles (step 710). For example, the averaged error may be an exponential average based on the equation $$e_{avg}(k)=\alpha e_{avg}(k-1)+(1-\alpha)e(k),$$

where α is a forgetting factor (with a value of, e.g., 0.7) and k is a reference to a set of pilot tones (e.g., k being the current set of pilot tones, and k−1 being the previous set of pilot tones).

If it is determined that the averaged error is greater than a predefined maximum threshold (step 712), then a control signal is provided that decreases a gain of the amplifier circuitry (step 714). If it is determined that the averaged error is less than a predefined minimum threshold (step 716), then a control signal is provided that increases a gain of the amplifier circuitry (step 718). If the averaged error is within the predefined maximum and minimum thresholds, then a control signal is provided that holds or maintains a previously set gain of the amplifier circuitry (step 720). In the embodiment described, the gain adjustment in the increase and decrease in steps 714 and 718 is of the same magnitude ("B"), preferably at +/−1 dB. The flowchart repeats again starting at step 702 for a next set of pilot tones (e.g., the next set of time-keyed pilot tones).

Preferably, a separate dual-loop AGC as described in relation to FIGS. 3–12 is utilized for each receiver branch shown in FIG. 2. Thus, two dual-loop AGCs are employed within each receiver unit. With this configuration, the amplifier gain may be controlled by the decision of only one of the AGCs, namely, a selected AGC having the better signal quality. Here, the better signal quality may be determined based on comparing received signal strength indicators (RSSI). More particularly, the signal quality for each branch may be determined based on pilot tone signal processing described in relation to FIG. 7, where the signal qualities of each branch are compared and the AGC associated with the branch having the better signal quality is the one selected for controlling the amplifier gain.

Thus, several automatic gain control (AGC) methods for use in an OFDM receiver have been described. One AGC method includes the steps of repeatedly performing a first AGC process which adjusts amplifier gain based on determining that a signal level of multiple time sample values is outside a limit set by a first predefined threshold; and repeatedly performing a second AGC process which adjusts the amplifier gain based on determining that a signal level of multiple frequency sample values associated with a plurality of pilot tones is outside a limit set by a second predefined threshold. Here, the first AGC process may be executed repeatedly at a first rate and the second AGC process may be executed repeatedly at a second rate that is less than the first rate.

Another method involves the steps of receiving radio frequency (RF) OFDM signals; amplifying the RF OFDM signals with amplifier circuitry; sampling the amplified RF OFDM signals with analog-to-digital (A/D) circuitry to generate a plurality of time domain samples; determining, with one or more processors, if the amplified RF OFDM signals are being clipped by the A/D circuitry based on a signal level of multiple time domain samples and a predefined threshold; and adjusting a gain of the amplifier circuitry if it is determined that the amplified RF OFDM signals are being clipped. This method may be performed in connection with AGC circuitry comprising amplifier circuitry to amplify radio frequency (RF) OFDM signals; A/D circuitry coupled to receive amplified RF OFDM signals from said amplifier circuitry; one or more processors coupled to receive a plurality of time domain samples of the amplified RF OFDM signals from said A/D circuitry, to determine whether the amplified RF OFDM signals are being clipped by the A/D circuitry based on a signal level of multiple time domain samples and a predefined threshold, and to produce a gain control signal for adjusting a gain of said amplifier circuitry if it is determined that the amplified RF OFDM signals are being clipped.

Finally, a wireless OFDM receiver having an automatic gain control (AGC) may include amplifier circuitry to amplify incoming radio frequency (RF) OFDM signals; A/D circuitry coupled to receive the amplified RF OFDM signals from said amplifier circuitry; one or more processors coupled to receive a plurality of time domain samples of the amplified RF OFDM signals from said A/D circuitry and operative to convert the plurality of time domain samples to a plurality of frequency domain signals. The one or more processors are further operative to repeatedly perform a first AGC process comprising the steps of: generating a time sample value for each one of multiple time domain samples; determining whether the amplified RF OFDM signals are being clipped based on a signal level of the multiple time sample values and a first predefined threshold; and producing a gain control signal for adjusting a gain of said amplifier circuitry if it is determined that the amplified RF OFDM signals are being clipped. The one or more processors are further operative to repeatedly perform a second AGC process comprising the steps of: determining a signal level of the plurality of frequency domain signals; determining if channel fading has occurred based on the signal level of the plurality of frequency domain signals and a second predefined threshold; and adjusting a gain of the amplifier circuitry if it is determined that the channel fading has occurred.

Related description regarding the theory, operation, simulation results of the AGC are provided in the provisional application by H. Zhang, entitled, "Method For Automatic Gain Control In A Personal Wireless Access Network," U.S. Serial No. 60/140,622, filed Jun. 23, 1999, which is hereby incorporated by reference herein. It should be readily apparent and understood that the foregoing description is only illustrative of the invention and in particular provides preferred embodiments thereof. For example, the AGC described may be employed in a base unit as well as the receiver units. Various alternatives and modifications can be devised by those skilled in the art without departing from the true spirit and scope of the invention. Accordingly, the present invention is intended to embrace all such alternatives, modifications, and variations which fall within the scope of the appended claims.

What is claimed is:

1. An automatic gain control (AGC) method for use in an OFDM receiver, the AGC method comprising:
   repeatedly performing a first AGC process which adjusts amplifier gain based on determining that a signal level of multiple time sample values from a received OFDM signal is outside a limit set by a first predefined threshold; and
   repeatedly performing a second AGC process which adjusts the amplifier gain based on determining that a signal level of multiple frequency sample values associated with a plurality of pilot tones from the received OFDM signal is outside a limit set by a second predefined threshold.

2. The AGC method according to claim 1, wherein the first AGC process is performed repeatedly at a first rate and the second AGC process is performed repeatedly at a second rate that is less than the first rate.

3. The AGC method according to claim 1, wherein the received OFDM signal is sampled to generate a plurality of time domain samples, and the first AGC process is operative to calculate an absolute value of each one of multiple time domain samples to generate the multiple time sample values.

4. The AGC method according to claim 1, wherein the received OFDM signal is sampled to generate a plurality of time domain samples, and the first AGC process is operative to calculate a square of each one of multiple time domain samples to generate the multiple time sample values.

5. The AGC method according to claim 1, wherein the received OFDM signal is sampled to generate a plurality of time domain samples which are converted into a plurality of frequency domain signals, the first AGC process being operative to calculate a power of each one of multiple time domain samples to generate the multiple time sample values, and the second AGC process being operative to calculate a power of multiple frequency domain signals corresponding to the plurality of pilot tones to generate the multiple frequency sample values.

6. An automatic gain control (AGC) method for use in a wireless OFDM receiver, the AGC method comprising:
   receiving radio frequency (RF) OFDM signals;
   amplifying the RF OFDM signals with amplifier circuitry;
   sampling the amplified RF OFDM signals with analog-to-digital (A/D) circuitry to generate a plurality of time domain samples;

determining, with one or more processors, if the amplified RF OFDM signals are being clipped by the A/D circuitry based on a signal level of multiple time domain samples and a predefined threshold; and adjusting a gain of the amplifier circuitry if it is determined that the amplified RF OFDM signals are being clipped;

wherein, for each sample of the multiple time domain samples, determining if the amplified RF OFDM signals are being clipped further comprises:
generating a time sample value from the time domain sample;
comparing the time sample value to a limit set by a first predefined threshold;
incrementing/decrementing a counter if the time sample value is outside the limit set by the first predefined threshold;
comparing the counter with a limit set by a second predefined threshold; and
determining that the amplified RF OFDM signals are being clipped if the counter is outside the limit set by the second predefined threshold.

7. The AGC method according to claim 6, wherein the plurality of time domain samples correspond to RF OFDM signals over a first time period, the method further comprising:
repeating the above steps for each time period of a plurality of time periods subsequent to the first time period, each said subsequent time period having the same duration as the first time period.

8. The AGC method according to claim 6, further comprising:
maintaining a previous gain of the amplifier circuitry if it is determined that the RF OFDM signals are not being clipped.

9. The AGC method according to claim 6, wherein generating the time sample value comprises one of determining an absolute value or square of the time domain sample.

10. Automatic gain control (AGC) circuitry for an OFDM receiver, comprising:
amplifier circuitry that amplifies radio frequency (RF) OFDM signals;
analog-to-digital (A/D) circuitry coupled to receive amplified RF OFDM signals from said amplifier circuitry;
one or more processors coupled to receive a plurality of time domain samples of the amplified RF OFDM signals from said A/D circuitry;
said one or more processors operative to determine whether the amplified RF OFDM signals are being clipped by the A/D circuitry based on a signal level of multiple time domain samples and a predefined threshold; and
said one or more processors operative to produce a gain control signal for adjusting a gain of said amplifier circuitry if it is determined that the amplified RF OFDM signals are being clipped;
wherein, for each sample of the multiple time domain samples, to determine if the amplified RF OFDM signals are being clipped, said one or more processors is further operative to:
generate a time sample value;
compare the time sample value with a first predefined threshold;
increment/decrement a counter if the time sample value is outside a limit set by the first predefined threshold;
compare the counter with a limit set by a second predefined threshold; and
determine that the amplified RF OFDM signals are being clipped if the counter is outside the limit set by the second predefined threshold.

11. The AGC circuitry according to claim 10, further comprising:
said one or more processors being further operative to produce a gain control signal for maintaining a previous gain of the amplifier circuitry if it is determined that the amplified RF OFDM signals are not being clipped.

12. An automatic gain control (AGC) method for use in a wireless OFDM receiver, the AGC method comprising:
receiving radio frequency (RF) OFDM signals;
amplifying the RF OFDM signals with amplifier circuitry;
sampling the amplified RF OFDM signals with analog-to-digital (A/D) circuitry to generate a plurality of time domain samples;
converting, with one or more processors, the plurality of time domain samples to a plurality of frequency domain signals;
during the receiving, amplifying, sampling, and converting, performing a first AGC process repeatedly at a first rate, the first AGC process including the steps of:
determining, with the one or more processors, a time sample value for each one of multiple time domain samples;
determining, with the one or more processors, if the amplified RF OFDM signals are being clipped by the A/D circuitry based on a signal level of the multiple time sample values and a first predefined threshold;
adjusting a gain of the amplifier circuitry if it is determined that the amplified RF OFDM signals are being clipped;
during the receiving, amplifying, sampling, and converting, performing a second AGC process repeatedly at a second rate that is less than the first rate, the second AGC process including the steps of:
calculating, with the one or more processors, a signal level of multiple frequency domain signals corresponding to a plurality of pilot tone signals;
determining, with the one or more processors, if channel fading has occurred based on the signal level of the multiple frequency domain signals and a second predefined threshold; and
adjusting a gain of the amplifier circuitry if it is determined that the channel fading has occurred.

13. The AGC method according to claim 12, wherein determining each time sample value comprises determining a magnitude or square of the time domain sample.

14. A wireless OFDM receiver having an automatic gain control (AGC), comprising:
amplifier circuitry, said amplifier circuitry to amplify incoming radio frequency (RF) OFDM signals;
analog-to-digital (A/D) circuitry, said A/D circuitry coupled to receive the amplified RF OFDM signals from said amplifier circuitry;
one or more processors, said one or more processors coupled to receive a plurality of time domain samples of the amplified RF OFDM signals from said A/D circuitry;
said one or more processors operative to convert the plurality of time domain samples to a plurality of frequency domain signals;

said one or more processors operative to repeatedly perform a first AGC process comprising the steps of:
generating a time sample value for each one of multiple time domain samples;
determining whether the amplified RF OFDM signals are being clipped based on a signal level of the multiple time sample values and a first predefined threshold;
producing a gain control signal for adjusting a gain of said amplifier circuitry if it is determined that the amplified RF OFDM signals are being clipped;

said one or more processors operative to repeatedly perform a second AGC process, said second AGC process comprising the steps of:
determining a signal level based on multiple frequency domain signals;
determining if channel fading has occurred based on the signal level of the multiple frequency domain signals and a second predefined threshold; and
adjusting a gain of the amplifier circuitry if it is determined that the channel fading has occurred.

* * * * *